United States Patent
Huang et al.

(10) Patent No.: US 6,693,451 B2
(45) Date of Patent: *Feb. 17, 2004

(54) INPUT/OUTPUT BUFFER CAPABLE OF SUPPORTING A MULTIPLE OF TRANSMISSION LOGIC BUSES

(75) Inventors: Jincheng Huang, Taipei (TW); Nai-Shung Chang, Taipei Hsien (TW); Yuangtsang Liaw, Taichung (TW)

(73) Assignee: Via Technologies, Inc., Taipei Hsien (TW)

(*) Notice: Subject to any disclaimer, the term of this patent is extended or adjusted under 35 U.S.C. 154(b) by 18 days.

This patent is subject to a terminal disclaimer.

(21) Appl. No.: 10/150,812

(22) Filed: May 17, 2002

(65) Prior Publication Data

US 2002/0125913 A1 Sep. 12, 2002

Related U.S. Application Data

(60) Continuation of application No. 09/733,697, filed on Dec. 8, 2000, now Pat. No. 6,420,898, which is a division of application No. 09/417,983, filed on Oct. 13, 1999, now Pat. No. 6,229,335.
(60) Provisional application No. 60/125,247, filed on Mar. 19, 1999.

(51) Int. Cl.$^7$ .................... H03K 19/003; H03K 19/094
(52) U.S. Cl. ................ 326/30; 326/27; 326/83
(58) Field of Search .................. 326/30, 26–27, 326/31, 34, 83, 86; 710/52

(56) References Cited

U.S. PATENT DOCUMENTS 5,666,078 A * 9/1997 Lamphier et al. ........... 327/108
5,869,984 A * 2/1999 Eto ................................ 326/86

* cited by examiner

Primary Examiner—James H Cho
(74) Attorney, Agent, or Firm—J. C. Patents

(57) ABSTRACT

An input/output buffer capable of supporting multiple transmission logic bus specifications. The input/output buffer has a coordinating controller, a logic control circuit, a first transistor, a second transistor, a first resistor element, and a second resistor element. The logic control circuit picks up a microprocessor signal to determine a particular kind of microprocessors used. According to the microprocessor being using, conductivity of the first transistor, the second transistor, the first resistor element and the second resistor element are reassigned to fit the particular logic bus specification of the microprocessor. Hence, a single chipset on a main circuit board is able to accommodate various kinds of microprocessors.

10 Claims, 3 Drawing Sheets

INPUT/OUTPUT BUFFER CAPABLE OF SUPPORTING A MULTIPLE OF TRANSMISSION LOGIC BUSES

CROSS-REFERENCE TO RELATED APPLICATION

This is a continuation application of U.S. Ser. No. 09/733,697 filed Dec. 8, 2000, now U.S. Pat. No. 6,420,898, which is a divisional application of U.S. Ser. No. 09/417,983, filed Oct. 13, 1999, now U.S. Pat. No. 6,229,335, which claims priority under 35 USC §119(e) from U.S. Provisional application Ser. No. 60/125,247 filed Mar. 19, 1999.

BACKGROUND OF THE INVENTION

1. Field of Invention

The present invention relates to a type of data transmission line. More particularly, the present invention relates to a type of data transmission line for connecting a microprocessor and a chipset.

2. Description of Related Art

In general, a microprocessor or a central processing unit (CPU) inside a personal computer is able to communicate with peripheral devices via a chipset. The chipset is an intermediate element for the exchange of data and control signals. The chipset has input/output leads that couple with a data transmission bus, and the bus leads to a connector above a main circuit board. Hence, any microprocessor plugged into the connector is able to communicate with the chipset directly.

Currently, the two most important bus specifications include gunning transceiver logic (GTL+) and high-speed transceiver logic (HSTL). GTL+bus is a standard specification created by Intel for transmitting data between a new generation of their microprocessors and external interfaces. The GTL+bus is suitable for high-speed microprocessors such as the Pentium II, Pentium III, the Pentium Pro and Socket 370. On the other hand, HSTL bus is an alternative specification employed by some microprocessors. The GTL+bus and the HSTL bus are really two different types of specifications. Hence, one chipset has to be used to interface with a microprocessor that employs a GTL+bus while another chipset has to be used to interface with a microprocessor that employs a HSTL bus.

FIG. 1 is a schematic diagram showing a GTL+data bus linking a microprocessor with a chipset. FIG. 2 is a schematic diagram showing a HSTL bus linking another microprocessor with a chipset. A few similarities between the transmission buses shown in FIGS. 1 and 2 can be found. Terminal voltages $V_{TT}$ for both of them are identical, for example, $V_{TT}=1.5V$. Reference voltages $V_{REF}$ for both of them are also identical at about 1.0V (if $V_{TT}=1.5V$), or $V_{REF}=\frac{2}{3}*V_{TT}$ or $0.68*V_{TT}$. Both the GTL+bus 12 and the HSTL bus 22 use the same type of connectors 14 and 24 having identical dimensions. A microprocessor 16 having its own printed circuit board 16a is shown in FIG. 1. The circuit board 16a is plugged into a connector 14 above a main circuit board 10a so that the microprocessor 16 is connected to a chipset 10. Similarly, a microprocessor 26 having its own printed circuit board 26a is shown in FIG. 2. The circuit board 26a is plugged into a connector 24 above a main board 20a so that the microprocessor 26 is connected to a chipset 20.

A comparison of the GTL+bus and the HSTL bus shows that their differences lie mainly in the arrangement of the transmission lines. The GTL+transmission line 12 in FIG. 1 has one or two 56 ohms pull-up resistors $R_{tt}$ to increase the bus voltage level. Because the resistor $R_{tt}$ also happens to be close to the end of the transmission line, the resistor serves also as an end-termination resistor capable of preventing signal ring back. On the other hand, the HSTL transmission line 22 in FIG. 2 has two 100 ohms pull-up resistors $R_{tt}$ to increase bus voltage level. The resistors $R_{tt}$ do not serve as an end-termination resistor. The HSTL transmission line 22 further includes a serial resistor $R_{tt}$ of about 22 ohms between the chipset 20 and the input/output (IO) terminals of the microprocessor 26. The resistor $R_s$ mainly serves as a damper for transmission signals.

The aforementioned description illustrates that GTL+bus and HSTL bus are configured to follow two specifications from two different types of microprocessors. As a result, different chipsets must be used. Since a chipset is usually fixed onto the main board by manufacturers, a user's choice of microprocessor is limited.

SUMMARY OF THE INVENTION

The invention provides a chipset capable of supporting different transmission buses so that a user is free to choose the type of microprocessor.

The invention provides an input/output buffer capable of detecting the type of microprocessor plugged into the connector on a main circuit board. Once the type of microprocessor is known, an appropriate amount of resistance can be automatically attached to the input/output leads of a chipset for operating the transmission bus of that particular type of microprocessor.

The invention also provides an input/output buffer capable of adjusting the amount of resistance attached to the input/output leads of a chipset. Hence, the same chipset can be used for operating different types of microprocessors each having a different transmission bus specification.

The invention also provides an input/output buffer having special circuits capable of reducing undesirable ring back from a transmission logic bus and lowering power consumption.

To achieve these and other advantages and in accordance with the purpose of the invention, as embodied and broadly described herein, the invention provides an input/output buffer capable of supporting a multiple of transmission buses. The input/output buffer is connected to various terminals of a microprocessor connector by a plurality of transmission lines. The input/output buffer comprises a coordinating controller; a logic control circuit for receiving a microprocessor-type signal from a microprocessor; a first transistor and a second transistor, in which one terminal of each transistor is coupled to an input/output pad of the input/output buffer while another terminal is grounded and a control terminal of each transistor is coupled to the logic control circuit; a first resistor element having three terminals, in which one terminal is coupled to a terminal voltage source while another terminal is coupled to a terminal of the first transistor and a control terminal of the first resistor element is coupled to the coordinating controller; a second resistor element having three terminals, in which one terminal is coupled to a terminal voltage source while another terminal is coupled to a terminal of the second transistor, a control terminal of the second resistor element being able to receive a control signal so that electrical conductivity of the second resistor element can be set; and a buffer having three terminals, in which one terminal is coupled to the input/output pad, one terminal is coupled to a reference voltage and an output terminal is coupled to the coordinating controller. The buffer receives a signal from the input pad and compares the signal with the reference voltage to produce an output voltage. The output voltage is sent to the coordinating controller so that resistance of the first resistor element is adjusted accordingly.

When the detection signal from the microprocessor is at a first voltage level such as a logic state of '1', both the first transistor and the second resistor remain conductive. The transmission line is configured according to the HSTL bus specification, for example. However, if the detection signal from the microprocessor is at a second voltage level such as a logic state of '0', the first transistor, the second transistor and the first resistor all remain conductive. The transmission line is configured to the GTL+bus specification, for example.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
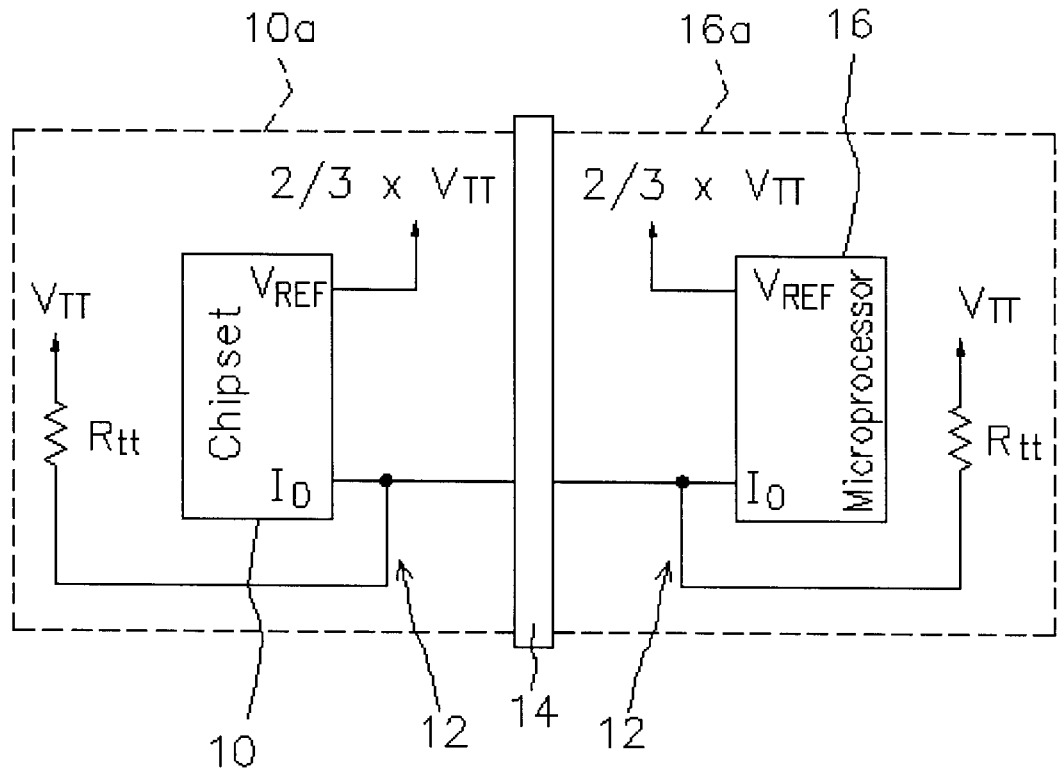
FIG. 1 is a schematic diagram showing a GTL+data transmission bus linking a microprocessor with a chipset.

Reference will now be made in detail to the present preferred embodiments of the invention, examples of which are illustrated in the accompanying drawings. Wherever possible, the same reference numbers are used in the drawings and the description to refer to the same or like parts.

Figure 3:
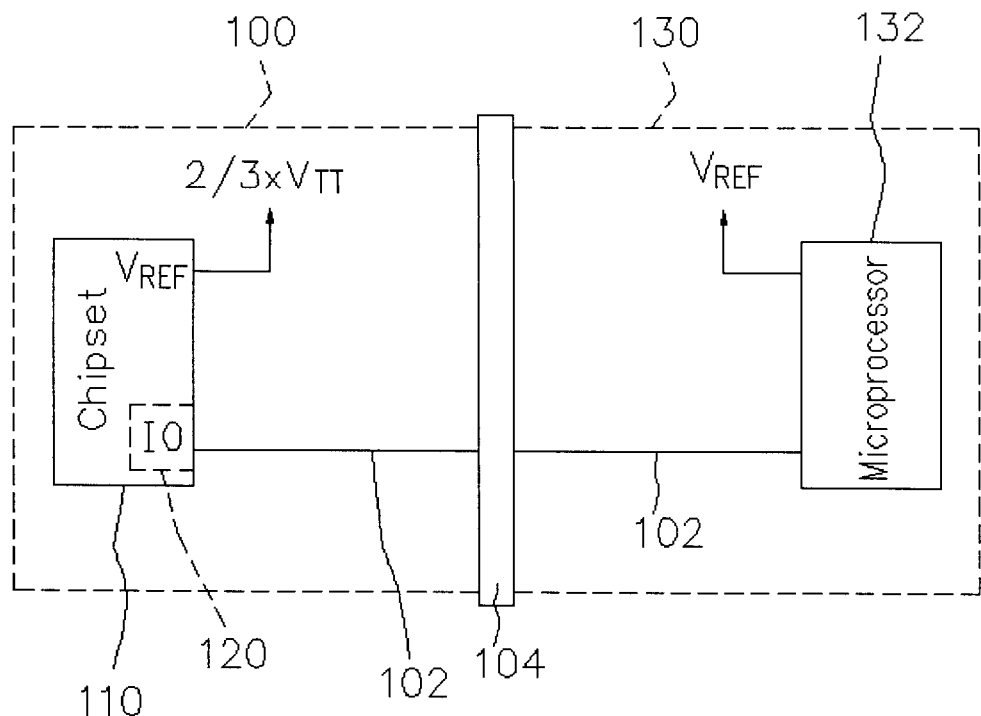
FIG. 3 is a schematic diagram showing the interconnections between an input/output buffer, a chipset and a microprocessor according to this invention.

FIG. 3 is a schematic diagram showing the interconnections between an input/output buffer, a chipset and a microprocessor according to this invention. As shown in FIG. 3, an input/output buffer 120 inside a chipset 110 above a main board 100 is connected to a microprocessor module 130 by means of transmission lines 102. According to this invention, conventional pull-up resistor $R_{tt}$ and serial resistor $F_s$ usually associated with the circuit on a main board are omitted. Nevertheless, the chipset 120 is able to support both GTL+and HSTL transmission logic buses. In addition, a resistor $R_s$ (not shown) may be added between an outlet of the buffer 120 and the transmission line 102 depending on actual need.

Since a microprocessor may have over a hundred leads for data transmission, the elimination of the pull-up resistor Rtt and the serial resistor Rs saves manufacturing cost and reduces the complexity of line connections of the main board. The following is a detailed description of a layout of the input/output buffer that simultaneously supports both GTL+and HSTL transmission logic buses.

Figure 4:
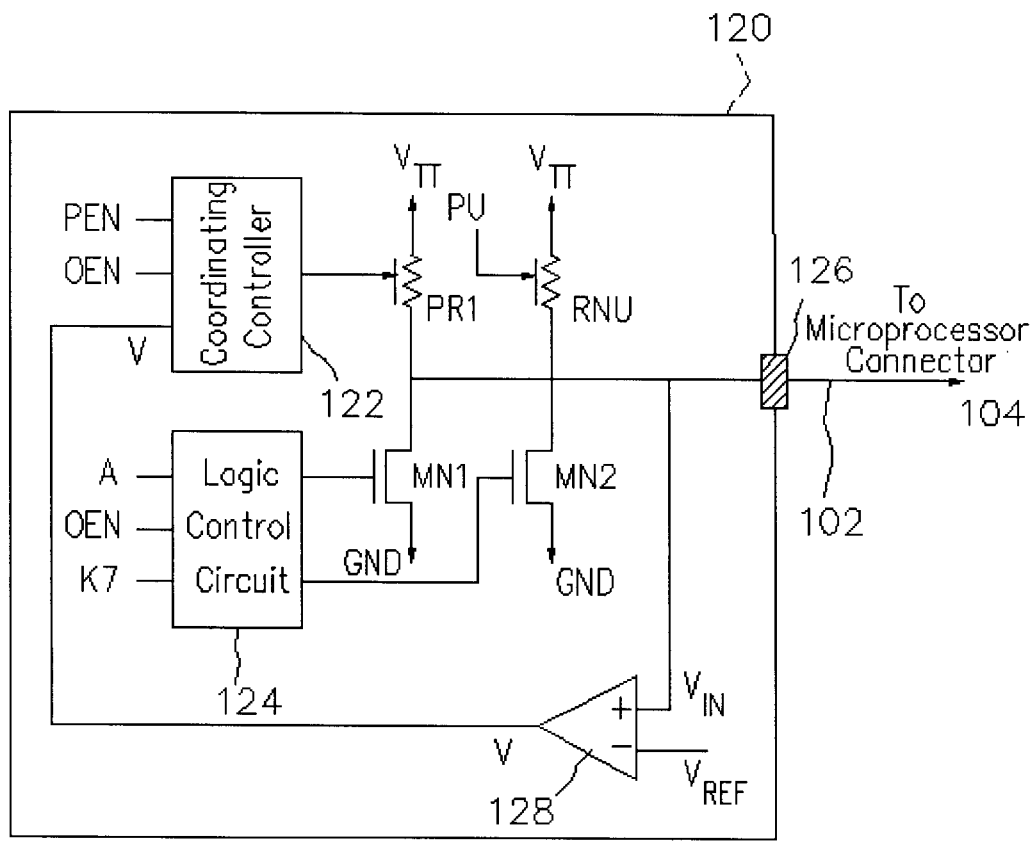
FIG. 4 is a schematic diagram showing the internal connections between various elements inside the input/output buffer according to this invention.

FIG. 4 is a schematic diagram showing the internal connections between various elements inside the input/output buffer according to this invention.

The input/output buffer 120 of this invention is connected to a microprocessor connector 104 by means of the transmission lines 102. The input/output buffer 120 includes a coordinating controller 122, a logic control circuit 124, a first transistor MN1, a second transistor MN2, an input/output pad 126, a first controllable resistor PR1, a second controllable resistor RNU and a buffer 128. The logic control circuit 124 has an input terminal for picking up a microprocessor-type signal K7 when a certain type of microprocessor is plugged into the connector 104. From this signal K7, the logic control circuit 124 can identify the microprocessor type so that the input/output buffer can respond appropriately. The first transistor MN1 and the second transistor MN2 are coupled to the logic control circuit 124 and the input/output pad 126, respectively. Both the first transistor MN1 and the second transistor MN2 are controlled by the logic control circuit 124. The channel of transistors MN1 and MN2 can be opened or closed depending on the signal K7. The first and the second transistors MN1 and MN2 can be NMOS transistors, for example.

The first resistor PR1 is coupled to a terminal voltage source $V_{TT}$ and one end of the first transistor MN1. Conductivity of the first resistor PR1 can be changed by signals from the coordinating controller 122 to a control terminal of the resistor PR1. A voltage of about 1.5V can be applied to the terminal voltage source $V_{TT}$, and the PR1 resistor can be an NMOS transistor, for example. The second resistor RNU is coupled to a terminal voltage source $V_{TT}$ and one end of the second transistor MN2. The second resistor RNU also has a third terminal capable of receiving a control signal PU, which controls the conductivity of the resistor RNU itself. The equivalent resistance of the second resistor RNU is about 100 ohms depending on the specification of the transmission bus. The resistor RNU can be implemented using either a PMOS or an NMOS transistor. Alternatively, the resistor RNU can be implemented using a resistor and a PMOS transistor connected serially together with the resistor having a resistance of about 80 ohms.

The buffer 128 has two input terminals and an output terminal. One of the input terminals is connected to the input/output pad 126 for receiving a signal voltage $V_{IN}$. The other input terminal is connected to a reference voltage $V_{REF}$. The signal voltage $V_{IN}$ is compared with the reference voltage $V_{REF}$ to produce a voltage signal V. The voltage signal V is transmitted to the coordinating controller 122 so that resistance of the first resistor PR1 can be modified accordingly. In general, the resistance of the resistors PR1, RNU and of the transistors MN1, MN2 can be designed according to the actual specifications of the particular logic buses to be supported.

If the microprocessor-type signal K7 received by the logic control circuit 124 is at a first potential such as a logic state of '1', the channel of both the first transistor MN1 and the second resistor RNU are conductive. The transmission lines 102 will function according to the specification of a first type of transmission bus. If the RNU resistor is designed to be about 100 ohms while the equivalent resistance is designed to be about 22 ohms, the first type of transmission bus is actually a HSTL bus. On the other hand, if the signal K7 received by the logic control circuit 124 is at a second potential such as a logic state of '0', the channel of the first transistor MN1, the second transistor MN2 and the first resistor PR1 are all conductive. The transmission lines 102 will function according to the specification of a second type of transmission bus, for example, a GTL+bus.

In the following, the two major transmission bus specifications including the GTL+bus and the HSTL bus are used to illustrate the embodiment of this invention.

Figure 2:
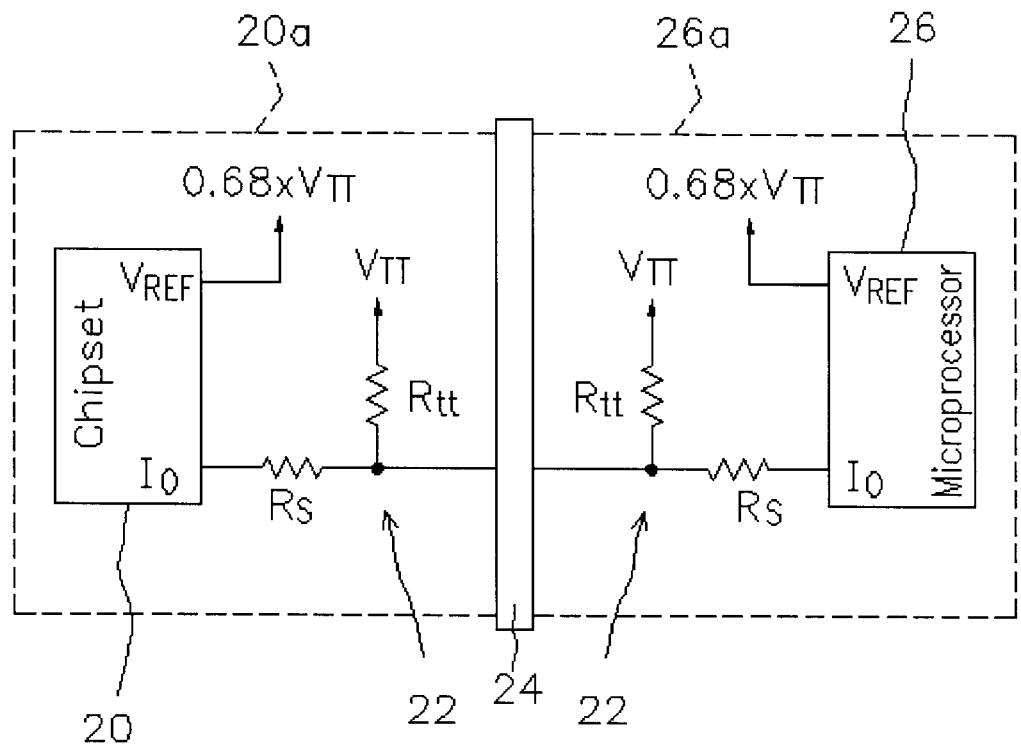
FIG. 2 is a schematic diagram showing a HSTL bus linking another microprocessor with a chipset.

As shown in FIG. 4, if a microprocessor working with a HSTL bus specification is plugged into the connector 104, a signal is sent to the microprocessor-type terminal K7 of the logic control circuit 124. Assuming that a logic state '1' represents a microprocessor that uses a HSTL bus, the resistor RNU and the transistor MN1 will be switched on so that they are conductive. The resistor RNU and the transistor MN1 become the main working components of the input/output buffer 120. Resistance of the transistor MN1 when conductive is designed to be equivalent roughly to the sum of the serial resistor $R_s$ and the resistance when the input/output buffer is conductive as shown in FIG. 2. Hence, the resistor $R_s$ on the main board is no longer needed. In addition, the resistor RNU can be designed to have a resistance of about 100 ohms serving as a pull-up resistor. After suitable adjustment, the resistance of the resistor RNU can fall within the range demanded by the bus specification. Therefore, a circuit equivalent to the HSTL bus in FIG. 2 is produced without the need for a pull-up resistor $R_{tt}$ and a serial resistor $R_s$ on the main board.

Similarly, as shown in FIG. 4, if a microprocessor working with a GTL+bus specification is plugged into the connector 104, a signal is sent to the microprocessor-type terminal K7 of the logic control circuit 124. Assuming that a logic state '0' represents a microprocessor that uses a GTL+bus, the resistor PR1 and the transistors MN1 and MN2 are switched on. Hence, the resistor PR1, the transistors MN1 and MN2 will be conductive and become the main working components of the input/output buffer 120. The resistor RNU is now shut off. The combined resistance of the resistor PR1 and the transistors MN1 and MN2 can be designed to be the equivalent to the resistance as seen by the GTL+bus in FIG. 1. Hence, the pull-up and terminal resistor $R_{tt}$ on the main board are no longer needed.

In brief, when the microprocessor module 130 is plugged into the connector 104, a signal will be sent to terminal K7 of the logic control circuit 124 informing the type of microprocessor being used. In response, some components selected from a group consisting of resistors PR1, RNU and transistors MN1, MN2 are made to be conductive creating a suitable environment for operating the microprocessor. Hence, through the generation of a microprocessor-type signal K7, the input/output buffer can at least support these two types of transmission logic buses. In addition, when the GTL+transmission logic bus configuration is chosen, the coordinating controller 122 will be activated for the reduction of ring back in the circuit and the reduction of power consumption.

The resistor PR1 can be implemented using a PMOS transistor. When voltage at the input/output pad 126 has a voltage of about 1.0V to 1.5V, the coordinating controller 122 output a 0V so that the resistor PR1 is conductive at a resistance of about 100 to 200 ohms. As soon as the voltage at the input/output pad 126 falls to a voltage less than 1.0V, the gate voltage of the PMOS transistor that serves as the resistor element PR1 gradually rises. Consequently, the equivalent resistance of the PMOS transistor also rises. After five to ten nano-seconds, the PMOS transistor becomes virtually nonconductive.

Figure 5:
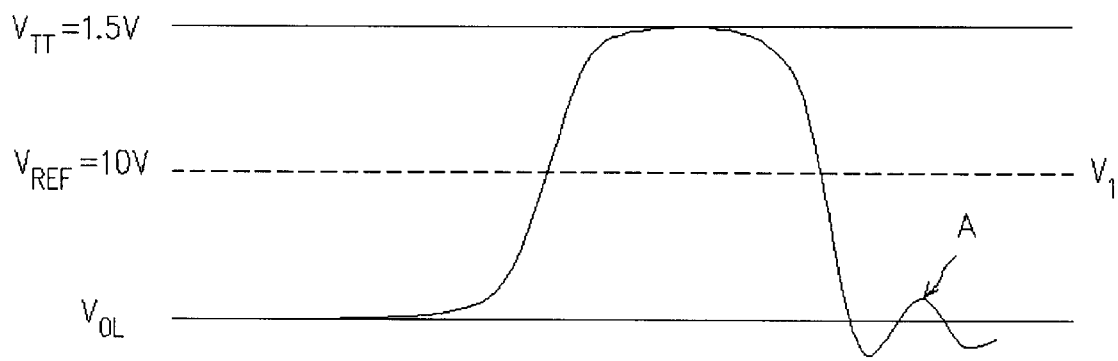
FIG. 5 is a plot showing an output waveform having reduced ring back signal due to the combined action of the coordinating controller and the resistors inside the input/output buffer.

Employing an actively switchable type of resistor PR1 has the advantage of effectively controlling signal ring back down to a voltage smaller than about 0.4V. FIG. 5 is a plot of an output waveform from an input/output buffer under the GTL+bus configuration showing some ring back reduction. As shown in FIG. 5, the peak voltage (0.4V) at point A of the first rebounce is already quite close to the stable voltage VOL (0.2V).

In summary, the input/output buffer of this invention includes at least the following advantages:

1. The input/output buffer is capable of detecting the type of microprocessor plugged into the connector on a main circuit board. Once the type of microprocessor is known, an appropriate amount of resistance can be attached to the input/output leads of a chipset for operating the transmission bus of that particular type of microprocessor.
2. Since the input/output buffer is capable of adjusting the amount of resistance attached to the input/output leads of a chipset, different types of microprocessors can use the same circuit board.
3. Since the same chipset can be used by microprocessor systems having different bus specifications, main circuit board design and production is simpler.
4. Since equivalent pull-up resistors, terminal resistors and serial resistors have already been assembled inside the input/output buffer of the chipset, many resistors normally associated with a conventional main circuit board can be deleted. Therefore, manufacturing cost is reduced and complexity of line connections on a main circuit board is greatly simplified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A main circuit board structure, comprising:
   a microprocessor connector ready for a microprocessor to plug in, such that as the microprocessor is plugged into the microprocessor connector, a microprocessor signal is, generated, wherein the microprocessor signal indicates one of a plurality of logic bus schemes for the microprocessor; and
   a chipset having an input/output buffer, wherein the input/output buffer can receive the microprocessor signal and configure the chipset to work under the indicated one of the logic bus schemes, wherein
   the input/output buffer includes:
      a logic control circuit, to receive the microprocessor signal and recognize the indicated one of the logic bus schemes; and
      a resistance adjusting circuit, which comprises a plurality of resistance routes, wherein the resistance adjusting circuit is coupled with and controlled by the logic control circuit, so as to produce an equivalent resistance for the chipset in operation under the indicated one of the logic bus schemes.

2. The main circuit board structure of claim 1, the indicated one of the logic bus schemes comprises a high speed transceiver logic (HSTL) bus or a gunning transceiver logic (GTL+) bus.

3. The main circuit board structure of claim 1, wherein the microprocessor signal has a plurality of logic levels to respectively indicate the logic bus schemes.

4. The main circuit board structure of claim 1, wherein each of the resistance routes comprises a resistor and a MOS transistor.

5. The main circuit board structure of claim 1, wherein the resistance circuit includes one of the resistance routes, comprising:
- a MOS transistor, controlled by the logic control circuit for turning on or turning off, and
- a resistance element having a first terminal coupled to the MOS transistor in cascade and coupled to the microprocessor connector, and a second terminal coupled to a voltage source, wherein a resistance of the resistance element can be changed by a coordinating controller.

6. The main circuit board structure of claim 5, wherein the resistance element comprises a MOS transistor.

7. The main circuit board structure of claim 5, the coordinating controller receives a voltage signal, the voltage signal is produced after comparing the microprocessor signal with a reference signal and is used to change the resistance of the resistance element.

8. The main circuit board structure of claim 1, wherein the resistance circuit includes one of the resistance routes, comprising:
- a MOS transistor, controlled by the logic control circuit for turning on or turning off, and
- a resistance element having a first terminal coupled to the MOS transistor in cascade and coupled to the microprocessor connector, and a second terminal coupled to a voltage source, wherein a conductivity of the resistance element can be changed by a control signal that is received from a third terminal of the resistance element.

9. The main circuit board structure of claim 8, wherein the resistance element comprises a MOS transistor.

10. The main circuit board structure of claim 1, wherein the resistance routes of the resistance adjusting circuit includes two resistance routes, of which each one the two resistance routes has a controllable resistance from a control signal.

* * * * *